United States Patent
Kirloskar et al.

(10) Patent No.: US 6,429,517 B1
(45) Date of Patent: Aug. 6, 2002

(54) SEMICONDUCTOR DEVICE AND FABRICATION METHOD THEREOF

(75) Inventors: Mohan Kirloskar, Cupertino, CA (US); Michio Horiuchi; Yukiharu Takeuchi, both of Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 0 days.

(21) Appl. No.: 09/418,974

(22) Filed: Oct. 14, 1999

(30) Foreign Application Priority Data

Oct. 16, 1998 (JP) .......................................... 10-295048

(51) Int. Cl.$^7$ .............................................. H01L 21/44
(52) U.S. Cl. .................. 257/737; 257/734; 257/735; 257/787; 438/106
(58) Field of Search ........................ 438/106; 257/734, 257/735, 737, 787

(56) References Cited

U.S. PATENT DOCUMENTS 5,612,243 A * 3/1997 Verrett
5,925,934 A * 7/1999 Lim

FOREIGN PATENT DOCUMENTS

| EP | 0 987 749 | 3/2000 |
| JP | 61-104630 | 5/1986 |
| JP | 64-50539 | 2/1989 |
| JP | 5-90338 | 4/1993 |
| JP | 7-1773 | 1/1995 |
| JP | 11-145323 | 5/1999 |
| WO | 98/28955 | 7/1998 |

* cited by examiner

Primary Examiner—Kevin M. Picardat
Assistant Examiner—D. M. Collins
(74) Attorney, Agent, or Firm—Staas & Halsey LLP (57) ABSTRACT

A semiconductor device is provided which improves reliability by preventing connection defects with extensions and interface peeling occurring between a substrate and a sealing resin, and which can reduce the production cost by simplifying a fabrication process.

In this semiconductor device, each lead 16 for electrically connecting an electrode terminal 12 of a semiconductor chip to an external connection terminal 14 comprises an extension 17 extending parallel to an electrode terminal formation surface of the semiconductor chip 10 with a predetermined distance from the electrode terminal formation surface, an external connection terminal post 22 provided to one of the end portions of the extension 17, and an electrode terminal post 24 connected to the electrode terminal 12 of the semiconductor chip 10. The electrode terminal post 22 and the extension 17 are sealed by a sealing resin 18, and the distal end portion of the external connection terminal post 24 is exposed from the sealing resin 18.

13 Claims, 7 Drawing Sheets

SEMICONDUCTOR DEVICE AND FABRICATION METHOD THEREOF

BACKGROUND OF THE INVENTION

1. Field of the Invention

This invention relates to a semiconductor device and a fabrication method thereof. More particularly, this invention relates to a semiconductor device of the type in which an extension for connecting an electrode terminal of each semiconductor chip and an external connection terminal is sealed by sealing resin, and to a fabrication method of such a semiconductor device.

2. Description of the Related Art

Figure 10:
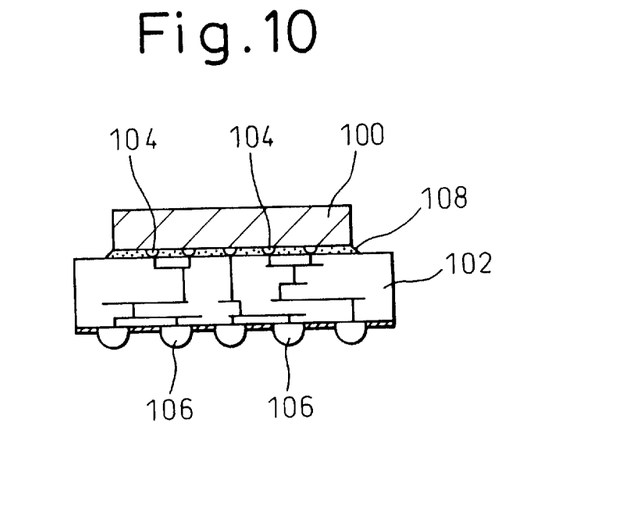
FIG. 10 is a sectional view showing an example of the semiconductor device of the prior art.

Semiconductor devices, the semiconductor chip of which is mounted on a substrate having substantially the same size as that of the semiconductor chip (hereinafter called the "chip size package"), include the one that is shown in FIG. 10. In the chip size package shown in FIG. 10, the semiconductor chip 100 is mounted on a substrate 102 that is a multi-layered substrate. An electrode terminal 104 of this semiconductor chip 100 and an external connection terminal 106 fitted to the substrate 102 are connected by internal wiring or through a via-hole.

Incidentally, a sealing resin 108 is poured into the space between the semiconductor chip 100 and the substrate 102, and seals the electrode terminal 104 of the semiconductor chip 100, and so forth.

The chip size package shown in FIG. 10 can be employed even when the number of electrode terminals 102 of the semiconductor chip 100 is large.

Because the substrate 102 has the multi-layered structure, however, connection defects of internal wiring or via-holes are more likely to occur inside the substrate 102. Also, interface exfoliation is likely to occur between the substrate 102 and the sealing resin 108 or between the semiconductor chip 100 and the sealing resin 108 due to the difference of the thermal expansion coefficient between the semiconductor chip 100 and the substrate 102.

Some of the chip size packages have a construction in which extension leads are extended on one surface of the substrate having the semiconductor chip mounted thereon, and the external connection terminals are bonded to the other surface of the substrate. In the chip size packages of such a type, too, the sealing resin is poured into the space between the semiconductor chip and the substrate and seals the electrode terminals of the semiconductor chip, and so forth. For this reason, interface exfoliation is likely to occur, in such chip size packages, between the substrate and the sealing resin or between the semiconductor chip and the sealing resin. Furthermore, because the extensions formed on one surface of the substrate and the external connection terminals formed on the other surface of the substrate are connected through via-holes, etc, penetrating through the substrate, connection defects between the extensions and the via-holes are likely to occur, too.

In these chip size packages of the prior art, the semiconductor chip is mounted on the substrate that is formed in advance, and needs the substrate formation step. Therefore, the production cost of the chip size packages becomes high.

SUMMARY OF THE INVENTION

It is therefore an object of the present invention to provide a semiconductor device that has improved reliability by preventing connection defects with extensions and interface exfoliation between a substrate and a sealing resin, and has reduced production cost due to a simple fabrication process, and also a fabrication method thereof.

The inventors of the present invention have realized that, in order to accomplish the objects described above, it is effective to omit the substrate 102 of the chip size package shown in FIG. 10, and have completed the present invention.

In other words, according to one aspect of the present invention, there is provided a semiconductor device of the type in which a lead for electrically connecting an electrode terminal of each semiconductor chip to an external connection terminal comprises an extension extending parallel to an electrode terminal formation surface of the semiconductor chip at a predetermined distance from the semiconductor chip, an external connection terminal post provided at one of the end portions of the extension, and an electrode terminal post provided to the other end portion of the extension and connected to the electrode terminal of the semiconductor chip; wherein the electrode terminal post and the extension are sealed by a sealing resin, and the distal end portion of the external connection terminal post is exposed from the sealing resin.

According to another aspect of the present invention, there is provided a method of fabricating a semiconductor device of the type in which an extension for connecting an electrode terminal to an external connection terminal of each semiconductor chip is sealed by a sealing resin, the method comprising the steps of: serially forming grooves at predetermined positions of a metal plate on which the external connection terminals are to be formed, external connection terminal posts by filling a metal into the grooves, extensions on the metal plate each having one of the ends thereof connected to the external connection terminal post, and electrode terminal posts each having one of the ends thereof connected to the other end portion of the extension and the other end thereof connected to the electrode terminal of the semiconductor chip; mounting the semiconductor chips in such a fashion that the electrode terminals of the semiconductor chips are connected to the other end of the electrode terminal posts; applying first etching to the metal plate from an open surface side on which the grooves are open, to a predetermined thickness in such a fashion as to obtain an etched surface of a metal plate having the predetermined thickness, filling a sealing resin between the etched surface of the metal plate and an electrode terminal formation surface of the semiconductor chips, and resin-sealing the extensions extending from the electrode terminal formation surface of the semiconductor chips with a predetermined distance therefrom, and the electrode terminal posts; and applying second etching to the exposed surface side of the metal plate in such a fashion as to form the external connection terminals at the distal end portion of the external connection terminal posts so exposed, and removing the metal plate.

In the present invention described above, the lead comprising the electrode terminal post, the extension and the external connection terminal post is preferably formed of gold, and this lead made of gold can be easily shaped by electrolytic gold plating using the metal plate as a power feed layer.

The sealing resin for sealing such a lead preferably has a Young's modulus of not greater than 1 GPa at room temperature.

The fitting strength of the external connection terminal can be improved by forming an external connection terminal made of a metal such as a solder at the distal end portion of the external connection terminal post. Such an external connection terminal can be formed by forming a metal layer of a solder, or the like, at the distal end portion of the external connection post by electrolytic metal plating using the metal plate as a power feed layer, and re-flowing the metal layer.

In the semiconductor device according to the present invention, the electrode terminal of the semiconductor chip and the external connection terminal are connected by the lead. Therefore, in comparison with semiconductor devices of the type in which a substrate is interposed between the semiconductor chip and the external connection terminal, the number of connection portions becomes smaller, and the connection defects of the internal wiring and the via-holes can be reduced.

Moreover, because the substrate for mounting the semiconductor chip can be omitted, the problem of the interface exfoliation between the substrate and the sealing resin or between the semiconductor chip and the sealing resin, that results from the difference of the thermal expansion coefficient between the substrate and the semiconductor device, can be eliminated, and the substrate formation step can be omitted in the fabrication process of the semiconductor device.

As a result, the present invention can reduce the production cost of the semiconductor device and can improve reliability of the resulting semiconductor device.

DESCRIPTION OF THE PREFERRED EMBODIMENTS

Figure 1:
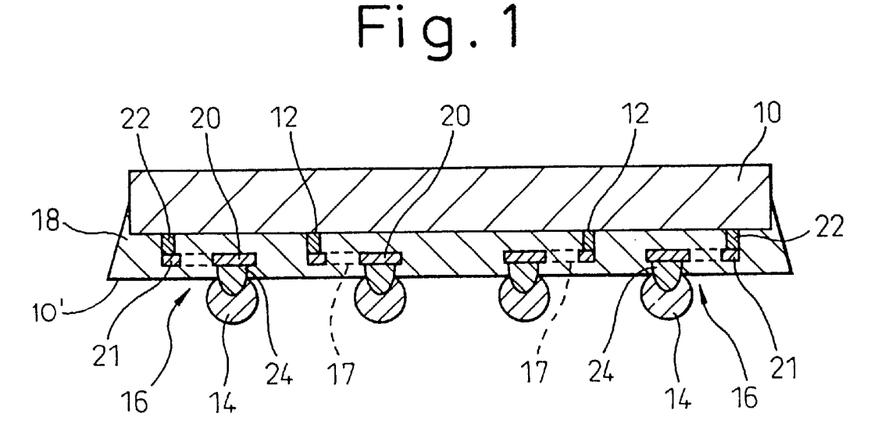
FIG. 1 is a partial sectional view showing an example of a semiconductor device according to the present invention.

An example of the semiconductor device according to the present invention will be explained with reference to FIGS. 1 and 2. FIG. 1 is a partial sectional view of the semiconductor device according to the present invention, and FIG. 2 is a plan view of leads 16 of the semiconductor device shown in FIG. 1.

In the semiconductor device shown in FIG. 1, electrode terminals 12 of a semiconductor chip 10 and ball-shaped external connection terminals 14 made of a solder are electrically connected to one another by leads 16. Almost all the portions of the leads 16 are formed inside a sealing resin 18 that is bonded with an electrode terminal formation surface 10' on which the electrode terminals 12 of the semiconductor chip 10 are formed.

Figure 2:
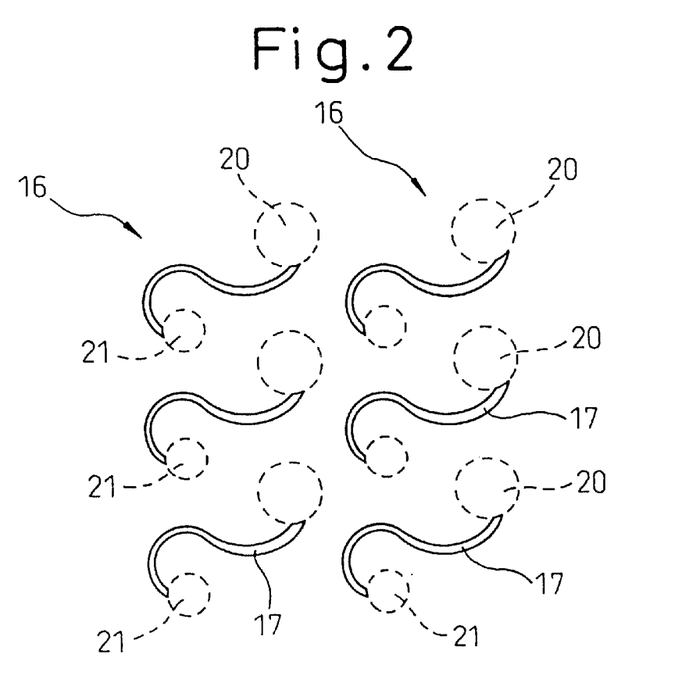
FIG. 2 is a plan view showing leads 16 of the semiconductor device shown in FIG. 1.

Each of the leads 16 comprises an S-shaped extension 17 extending in parallel with the electrode terminal formation surface 10' of the semiconductor chip 10 at a predetermined distance from the electrode terminal formation surface, 10' an electrode terminal post 22 that is connected to the electrode terminal 12 of the semiconductor chip 10, and an external connection terminal post 24 to which the external connection terminal 14 is connected, as shown in FIG. 2. In the lead 16 shown in FIG. 1, the electrode terminal post 22 is set up at one end 21 of the extension 17, and the external connection terminal post 24 is set up at the other end 20 of the extension 17 in the direction opposite to that of the electrode terminal post 22.

The extension lead 17 of the lead 16 is bent in a plane parallel to the electrode terminal formation surface 10' of the semiconductor chip 10 as shown in FIG. 2 in order to form the external connection terminal 14 at a predetermined position. Since the extension 17 is bent in this way, the extension 17 undergoes expansion and contraction in accordance with stresses such as a thermal stress resulting from the difference of the thermal expansion coefficient between the semiconductor chip 10 and a packaging substrate, and can mitigate the stress.

The distal end portion of the external connection terminal post 24 protrudes from the surface of the sealing resin 18, and the ball-shaped external connection terminal 14 made of a solder is formed. The distal end portion of the external connection terminal post 24 is disposed inside this external connection terminal 14 as a core. In consequence, the bonding strength of the external connection terminal 14 can be improved.

The extension lead 17, the electrode terminal post 22 and the external connection terminal post 24 that together constitute the lead 14 are preferably made of gold. Gold is extremely excellent both chemically and electrically in comparison with other metals, and can be used advantageously when the semiconductor device shown in FIG. 1 is fabricated as will be described later. Moreover, when tin plating is applied to the electrode terminals of the semiconductor chip 10, the electrode terminal post 22 made of gold and the electrode terminal of the semiconductor chip 10 can be bonded by a gold-tin eutectic alloy.

Those resins which have a Young's modulus of not greater than 1 GPa at room temperature, preferably a Young's modulus of 50 to 600 MPa at room temperature and 2 to 10 MPa at 100° C., can be used suitably as the sealing resin 18 shown in FIG. 1. More concretely, preferred examples of such resins include epoxy resins or polyolefinic resins in which a silicone type elastomer, NBR rubber, etc, are dispersed.

When the resin having a low Young's modulus is used for the sealing resin 18, the extension 17 formed in the bent shape is allowed to undergo expansion and contraction virtually without being impeded, as shown in FIG. 2, also, the thermal stress, etc, resulting from the difference of the thermal expansion coefficient between the packaging substrate and the semiconductor chip can be further mitigated.

The semiconductor device shown in FIG. 1 can be fabricated by using a copper plate covered on both surfaces thereof with a resist, in accordance with a fabrication process shown in FIGS. 3 to 6.

Figure 3A:
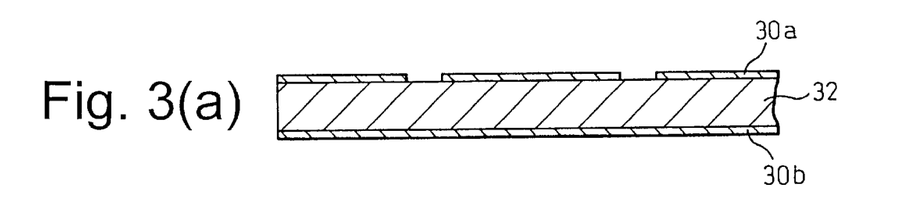
FIGS. 3(a) to 3(d) are sectional views showing a part of a fabrication process of the semiconductor device shown in FIG. 1.
Figure 3B:
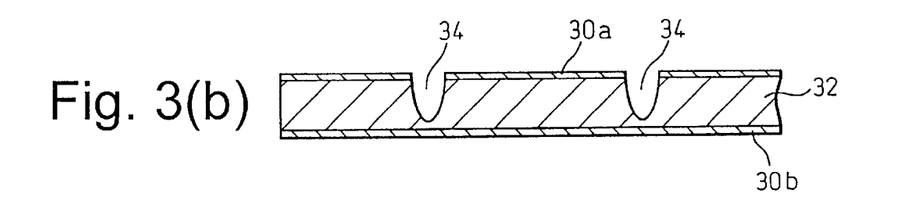
Figure 3C:
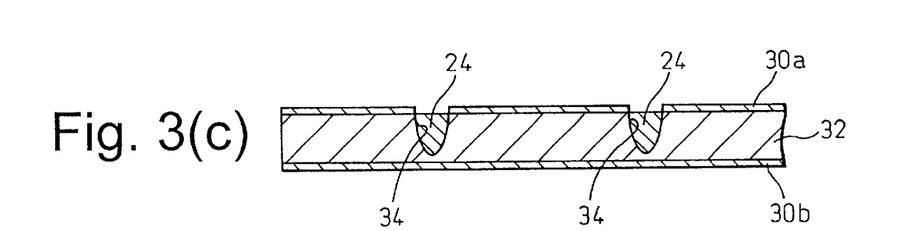

First, the resist 30a of the copper plate, at the positions at which the external connection terminal posts 24 are to be formed, is removed by etching as shown in FIG. 3(a). Thus, predetermined portions of the copper plate 32 are exposed. The exposed portions of the copper plate 32 are etched in such a fashion as to define grooves 34 each having a pointed bottom. Gold is then filled into each groove 34 by electrolytic gold plating by using the copper plate as the power feed layer, forming the connection terminal posts 24 having a pointed distal end [see FIGS. 3(b) and 3(c)].

Figure 3D:
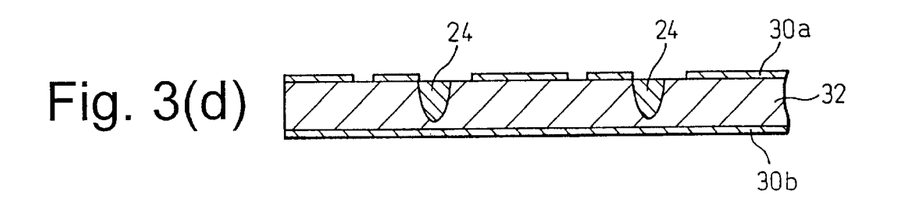

Furthermore, the resist 30a is etched to expose copper plate 32 in such a fashion as to profile the extension 17 to be formed [FIG. 3(d)].

Figure 4A:
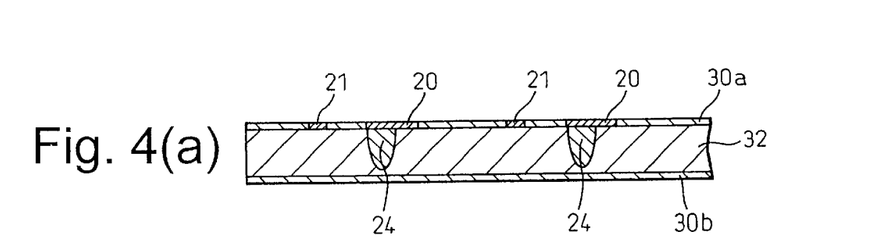
FIGS. 4(a) to 4(c) are sectional views showing another part of the fabrication process of the semiconductor device shown in FIG. 1.
Figure 4B:
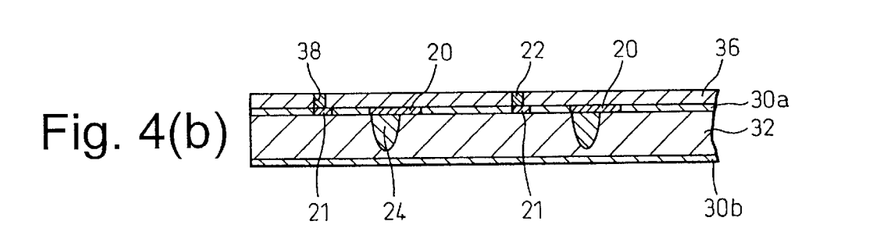
Figure 4C:
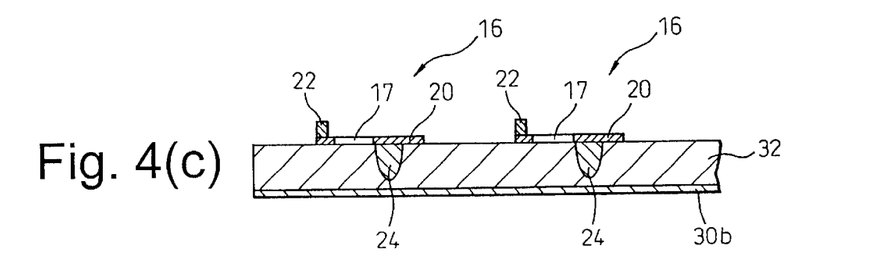

Electrolytic gold plating is applied, to the copper plate 32 that is exposed while profiling the extension lead 17 to be formed, by using the copper plate 32 as the power feed layer as shown in FIG. 4(c), forming the extension 17. The portions of the extension 17 shown in FIG. 4(c) are those portions which are formed at both end portions of the extension 17. In other words, they are one end portion 21 at which the electrode terminal post 22 is implanted and the other end portion 20 of the extension to be connected to the external connection terminal post 24.

The resist layer 36 applied to the resist 30a is etched further, and each groove 38, at the bottom of which the end portion 21 is exposed, is formed at the position at which the electrode terminal post 22 is to be formed. Electrolytic gold plating is applied using the copper plate 32 as the power feed layer so that gold fills up the groove 38. In this way, the electrode terminal post 22 is formed [FIG. 4(b)].

In the lead 16 comprising the extension 17, the electrode terminal post 22 and the external connection terminal post 24 thus formed, the extension 17 and the electrode terminal post 22 can be exposed on the copper plate 32 by etching and removing the resist 30a and the resist layer 36 [FIG. 4(c)].

Figure 5A:
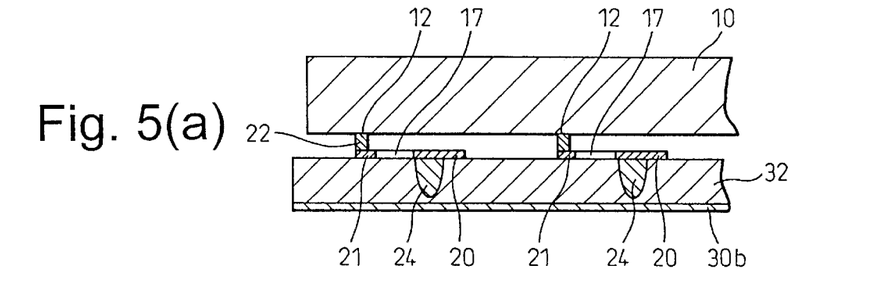
FIGS. 5(a) to 5(c) are sectional views showing another part of the fabrication process of the semiconductor device shown in FIG. 1.

The semiconductor chip 10 is mounted to the electrode terminal posts 22 exposed on the copper plate 32 as shown in FIG. 5(a). The electrode terminals 12 of this semiconductor chip 10 are connected to the electrode terminal posts 22.

Next, first etching is applied to the copper plate 32. In this case, the surface of the copper plate 32 covered with the resist 30b is not etched. Instead, the exposed surface of the copper plate after removal of the resist 30a is etched. In this instance, gold is not etched by the etching solution for copper. In consequence, the extension 17, the electrode terminal post 22 and the external connection terminal post 24 that are made of gold remain as such.

Figure 5B:
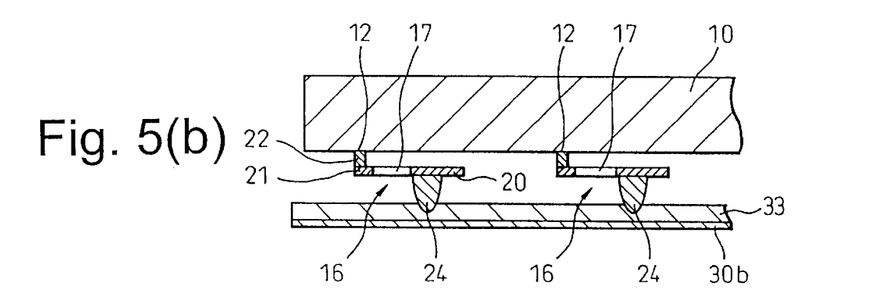

During this first etching, the copper plate 32 is not completely removed, but the copper plate 33, the thickness of which is thus reduced, is left in the proximity of the distal end portion of the external connection terminal post 24 [FIG. 5(b)]. In this way, the copper plate 33 having the reduced thickness connects the external connection terminal posts 24, 24 with one another.

Figure 5C:
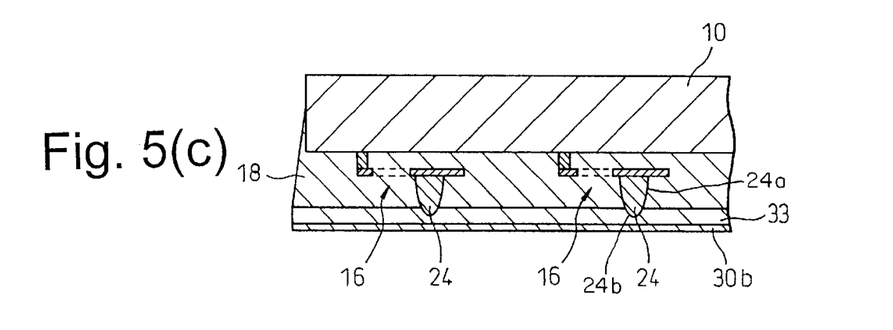

The clearance between the semiconductor chip 10 and the copper plate 33 is sealed by the sealing resin 18 [FIG. 5(c)]. This sealing resin 18 seals the extensions 17, the electrode terminal posts 22 and the major proportion, i.e., the base portion 29a of the external connection terminal posts 24 and such that the distal end portion, or tip 24b thereof, extending from the base portion 24a and beyond the sealing resin 18, is exposed.

Figure 6A:
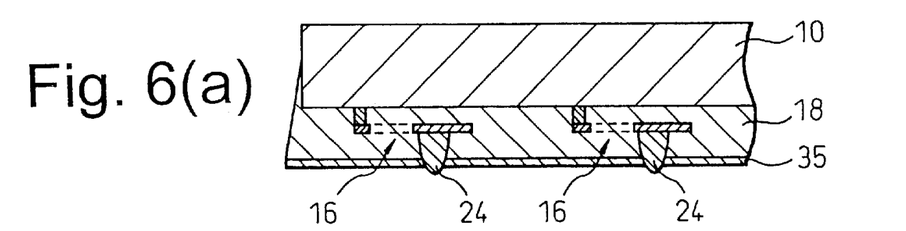
FIGS. 6(a) to 6(e) are sectional views showing another part of the fabrication process of the semiconductor device shown in FIG. 1.

Thereafter, as shown in FIG. 6(a), the resist 30b is removed, and second etching is applied to the copper plate 33 so as to convert it to a thin copper plate 35, and to expose the pointed distal end portion, or tip, of each external connection terminal post 24. In this instance, too, the portion near the distal end portion of the external connection terminal post 24 is left interconnected by the thin copper plate 35.

Figure 6B:
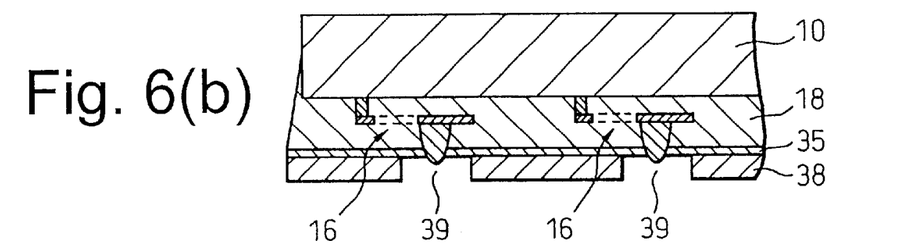

A resist 38 is applied by screen printing, or the like means, to the thinned copper plate 35 with the exception of the distal end portion of the external connection terminal posts 24 and the portions nearby [FIG. 6(b)]. On the bottom surface of the resist 38 so applied are formed grooves 39 to which the thin copper plate 35 and the distal end portions, or tip, of the external connection terminal posts 24 are exposed.

Figure 6C:
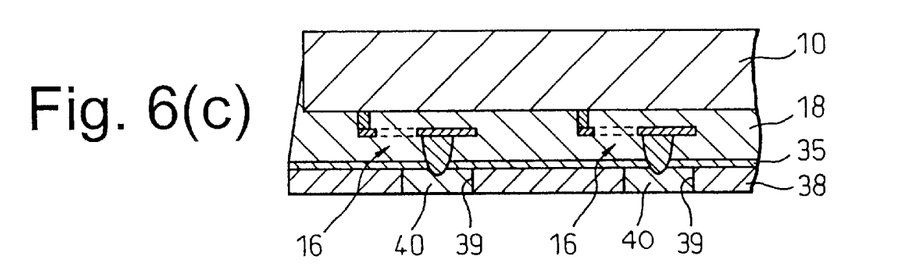

Solder fills up the grooves 39 due electrolytic plating using the thin copper plate 35 as the power feed layer, forming a solder portion 40 [FIG. 6(c)].

Figure 6D:
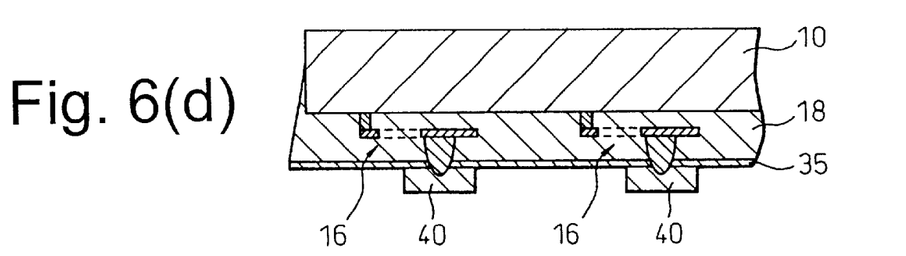
Figure 6E:
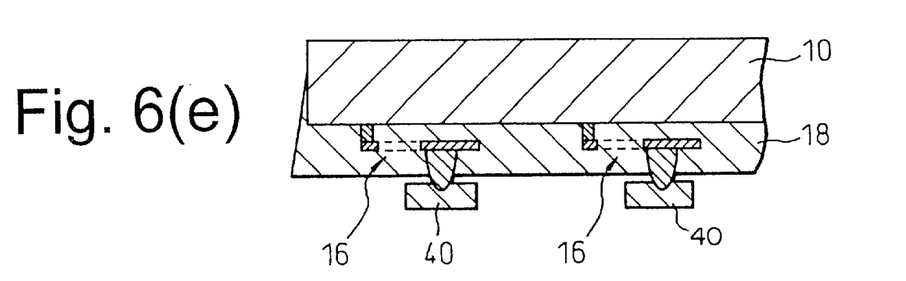

Next, after the resist 38 is removed, the thinned copper plate 35, too, is removed by etching, so that the solder portion 40 is bonded to the distal end portion of the external connection terminal post 24 [FIG. 6(c), 6(d) and 6(e)].

The ball-shaped external connection terminal 14 can be formed at the distal end portion of the external connection terminal post 24 by re-flowing the solder portion 40 as shown in FIG. 6(e), and the semiconductor device shown in FIG. 1 can be obtained.

In the fabrication process of the semiconductor device shown in FIGS. 3 to 6, the fabrication step of the substrate for mounting the semiconductor chip can be omitted, and the fabrication process of the semiconductor device can be simplified.

In FIGS. 3 to 6, the semiconductor device is fabricated by using the semiconductor chips that are cut into small pieces. However, the electrode terminal post 22 of the lead 16 may be connected to each electrode terminal formed on the wafer before the semiconductor chips are sliced into small pieces. When the wafer is used in this way, the ball-shaped external connection terminals 14 are formed by re-flowing the solder portion and then the wafer is sliced into the individual semiconductor devices, thereby providing the semiconductor device shown in FIG. 1.

Figure 7A:
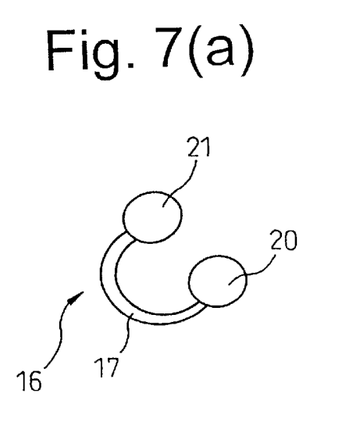
FIGS. 7(a) and 7(b) are plan views showing other examples of the leads 16 of the semiconductor device shown in FIG. 1.
Figure 7B:
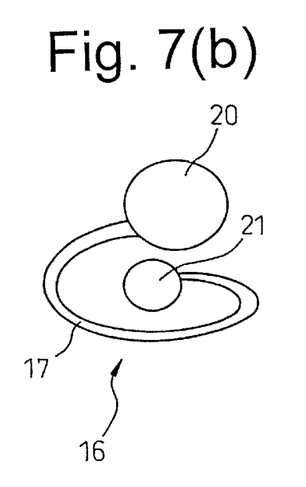

The shape of the extension, too, can be changed freely. For example, a U-shaped extension 17 shown in FIG. 7(a) or a loop-like shaped extension shown in FIG. 17 can be used, too, and these extensions may also be used in combination with the S-shaped extension 17 shown in FIG. 2.

Figure 8:
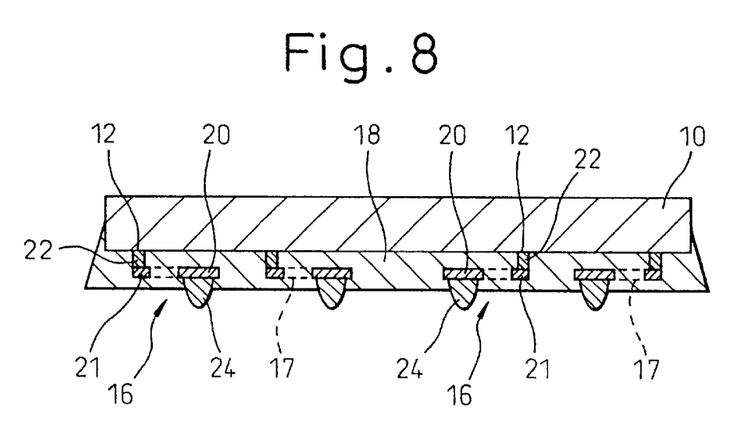
FIG. 8 is a partial sectional view showing another example of the semiconductor device according to the present invention.

In the semiconductor device shown in FIG. 1, the ball-shaped external connection terminal 14 is formed at the distal end portion of the external connection terminal post 24. However, the external connection terminal post 24 may be used alone as shown in FIG. 8. In order to mount the semiconductor device shown in FIG. 8 onto a packaging substrate, the distal end portions of the external connection terminal posts 24 are first positioned to the pads of the packaging substrate to which a brazing material paste such as a solder paste is in advance applied, and after the semiconductor device is packaged, the brazing material paste is bonded by re-flowing.

The semiconductor device shown in FIG. 8 can be obtained by removing the thinned copper plate 33 and the resist 30b after the process step of FIG. 5(c).

Figure 9:
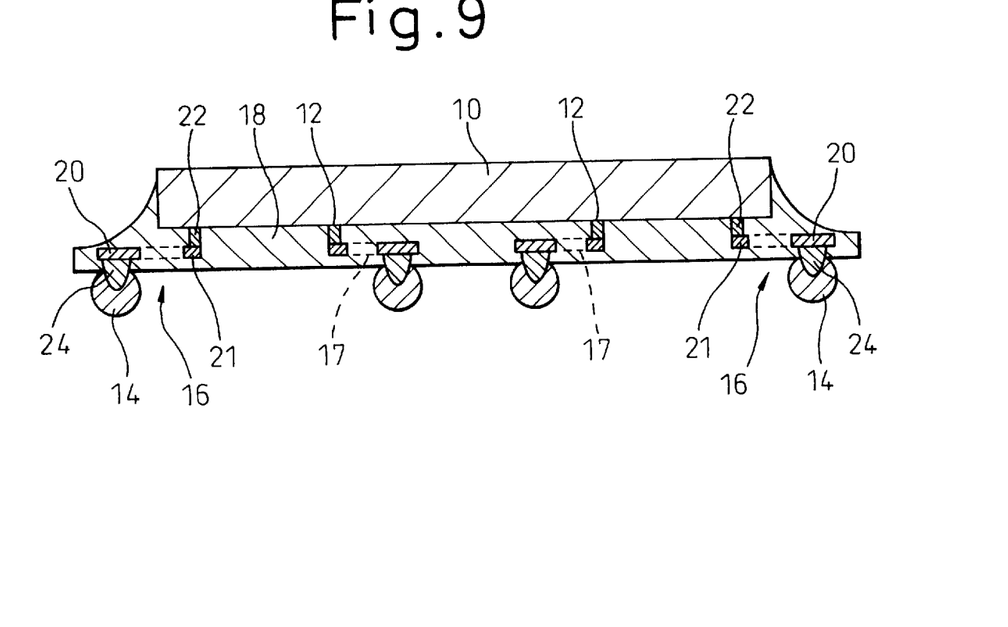
FIG. 9 is a partial sectional view showing still another example of the semiconductor device according to the present invention.

As shown in FIG. 9, the extension 17 may be extended so that the external connection terminal post 24 and the external connection terminal 14 of the lead 16 can be formed outside the outer wall of the semiconductor chip 10. The semiconductor device shown in FIG. 9 can be acquired by using the semiconductor chips 10 cut off from the wafer.

In the semiconductor device described so far, the electrode terminal post 22 is formed of gold, but it may be formed of solder. The electrode terminal post 22 formed of solder can be connected to the electrode terminal of the semiconductor chip 10 by solder bonding.

The external connection terminal post 24 is formed of gold, but various metal plating may be applied to the gold surface. More concretely, plating structures such as gold surface—nickel—gold, gold surface—palladium—gold, gold surface—nickel—solder, and so forth, from the gold surface as the base metal surface in the outer surface direction, can be employed. Furthermore, the external connection terminal post 24 may be formed of palladium, and various metal platings may be applied to the palladium surface. Concrete plating structures include palladium surface—nickel—palladium and palladium surface—gold—solder from the palladium surface as the base metal surface in the outer surface direction.

The present invention can reduce possible connection defects in internal wiring and via-holes because the number of connection positions is small. The present invention does not need the substrate for mounting the semiconductor chip, and can eliminate the problem of the interface peeling between the substrate and the sealing resin or between the semiconductor chip and the sealing resin that results from the difference of the thermal expansion coefficient between the substrate and the semiconductor chip. Moreover, the present invention can omit the substrate formation step in the fabrication process of the semiconductor device. As a result, the present invention can reduce the fabrication cost of the semiconductor device and can improve its reliability.

What is claimed is:

1. A semiconductor device of a type in which a lead for electrically connecting an electrode terminal of each semiconductor chip and an external connection terminal comprises an extension lead extending parallel to an electrode terminal formation surface of said semiconductor chip and spaced at a predetermined distance therefrom, an external connection terminal post provided on one end of said extension lead and a further electrode terminal post provided on the other end of said extension lead and connected to said electrode terminal of said semiconductor chip, said further electrode terminal post, said extension lead and a base portion of said external connection terminal post being sealed by a sealing resin, and a tip portion of said external connection terminal post, extending from said base portion thereof and beyond the sealing resin is exposed.

2. A semiconductor device according to claim 1, wherein said lead composed of said electrode terminal post, said extension lead and said external connection terminal post is made of gold.

3. A semiconductor device according to claim 1, further comprising an external connection terminal made of a metal having a low melting temperature, such as solder, and formed on the tip portion of said external connection terminal post.

4. A semiconductor device according to claim 1, wherein the tip portion of said external connection terminal post comprises an external connection terminal.

5. A semiconductor device according to claim 1, wherein the Young's modulus of said sealing resin at room temperature is not greater than 1 GPa.

6. A semiconductor device according to claim 2, further comprising an external connection terminal made of a metal having a low melting temperature, such as solder, and formed on the tip portion of said external connection terminal post.

7. A semiconductor device according to claim 2, wherein the Young's modulus of said sealing resin at room temperature is not greater than 1 GPa.

8. A semiconductor device according to claim 3, wherein the Young's modulus of said sealing resin at room temperature is not greater than 1 GPa.

9. A semiconductor device according to claim 4, wherein the Young's modulus of said sealing resin at room temperature is not greater than 1 GPa.

10. A semiconductor device, comprising:
    a semiconductor chip having an electrode terminal formation surface at which electrode terminals of the semiconductor chip are exposed;
    an electrode terminal post extending from an electrode terminal on the electrode terminal formation surface;
    an extension lead extending parallel to the electrode terminal formation surface and spaced at a predetermined distance therefrom and having first and second ends, an internal electrode terminal post extending from the first end transversely to, and contacting the electrode terminal on, the electrode terminal formation surface and an external connection terminal post extending from the second end transversely to and away from the electrode terminal formation surface; and
    a sealing resin layer formed on the electrode terminal formation surface and of a thickness embedding therewithin the internal electrode terminal post, the extension lead and a base portion of the external connection terminal post, a tip portion thereof, extending from the base portion and beyond the sealing resin layer, being exposed.

11. A semiconductor device according to claim 10, wherein the first and second end portions of the extension lead are of enlarged lateral dimensions relatively to a width dimension of the extension lead, in a plane parallel to the electrode terminal formation surface.

12. A semiconductor device according to claim 10, wherein at least a portion of the extension lead, intermediate the first and second ends thereof, is of a curvilinear configuration.

13. A semiconductor device according to claim 10, further comprising a solder ball formed on and connected to the exposed tip portion of the external connection terminal post.

* * * * *

UNITED STATES PATENT AND TRADEMARK OFFICE
CERTIFICATE OF CORRECTION

PATENT NO.    : 6,429,517 B1
DATED         : August 6, 2002
INVENTOR(S)   : Mohan Kirloskar et al.

It is certified that error appears in the above-identified patent and that said Letters Patent is hereby corrected as shown below:

<u>Column 5,</u>
Line 62, change "29a" to -- 24a --.

Signed and Sealed this

Eleventh Day of March, 2003

JAMES E. ROGAN
*Director of the United States Patent and Trademark Office*